United States Patent
Wei et al.

(10) Patent No.: US 9,407,273 B1
(45) Date of Patent: Aug. 2, 2016

(54) DIGITAL DELAY-LOCKED LOOP (DLL) TRAINING

(71) Applicant: Intel Corporation, Santa Clara, CA (US)

(72) Inventors: Fangxing Wei, Folsom, CA (US); Michael J Allen, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/730,514

(22) Filed: Jun. 4, 2015

(51) Int. Cl.
*H03L 7/06* (2006.01)
*H03L 7/081* (2006.01)
*H03L 7/08* (2006.01)

(52) U.S. Cl.
CPC ............ *H03L 7/0814* (2013.01); *H03L 7/0802* (2013.01); *H03L 7/0816* (2013.01)

(58) Field of Classification Search
USPC .................................. 327/147–149, 156–158
See application file for complete search history.

(56) References Cited

U.S. PATENT DOCUMENTS

| 6,044,122 A * | 3/2000 | Ellersick | H04L 7/0338 327/12 |
|---|---|---|---|
| 2006/0066368 A1* | 3/2006 | Gabato | H03K 5/1504 327/158 |
| 2012/0119803 A1* | 5/2012 | Machnicki | H03L 7/0812 327/158 |
| 2012/0126868 A1* | 5/2012 | Machnicki | H03L 7/0814 327/158 |
| 2012/0249193 A1* | 10/2012 | Willey | G11C 7/222 327/142 |
| 2013/0176787 A1* | 7/2013 | Ross | G11C 8/18 365/185.18 |
| 2014/0253193 A1* | 9/2014 | Willey | H03F 3/45183 327/158 |
| 2015/0054555 A1* | 2/2015 | Berkram | H03L 7/0812 327/158 |
| 2015/0235691 A1* | 8/2015 | Kwak | G11C 11/4076 365/194 |
| 2015/0236706 A1* | 8/2015 | Kim | H03L 7/08 327/158 |
| 2015/0244549 A1* | 8/2015 | Crain | H04L 27/0014 375/316 |
| 2015/0263686 A1* | 9/2015 | Lesso | H03M 1/0624 341/144 |
| 2016/0065196 A1* | 3/2016 | Fiedler | H03K 5/159 327/284 |

* cited by examiner

Primary Examiner — Adam Houston
(74) Attorney, Agent, or Firm — Grossman, Tucker, Perreault & Pfleger, PLLC

(57) ABSTRACT

A DLL may include a DLL training circuit that provides a feedback signal to the DLL and receives a first delay code value from the DLL that corresponds to the delay added to the feedback signal to align a leading edge transition in the feedback signal with a leading edge transition in the reference clock signal. The DLL training circuit further provides an inverted feedback signal to the DLL and receives a second delay code value from the DLL that corresponds to the delay added to the inverted feedback signal to align a leading edge transition in the inverted feedback signal with a leading edge transition in the reference clock signal. The DLL selectively adds the delay code corresponding to the temporally smaller of the first delay code value or the second delay code value to the feedback signal to align the feedback signal with the reference clock signal.

25 Claims, 7 Drawing Sheets

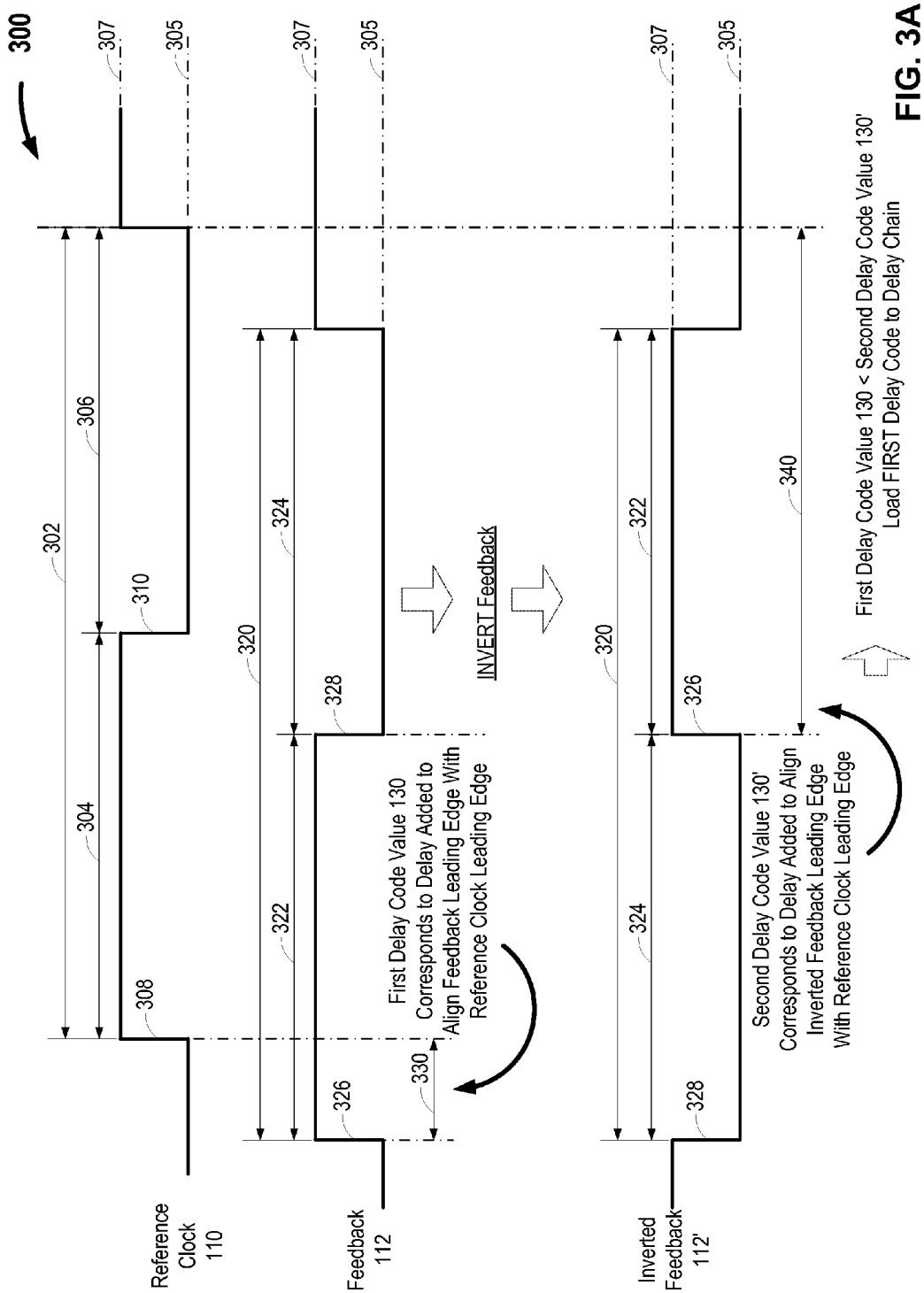

DIGITAL DELAY-LOCKED LOOP (DLL) TRAINING

TECHNICAL FIELD

The present disclosure relates to providing a digital training scheme to achieve minimum locking code to minimize digital delay-locked loop (DLL) power supply sensitivity.

BACKGROUND

In double data rate (DDR) input/output design, a delay-locked loop is often used to align the DQ clock and the DQS strobe with a reference clock signal. Such alignment is accomplished by the DLL adding to the reference clock delay chain a delay sufficient to align a leading edge of a pulse in the reference clock signal with a leading edge of a pulse in a system feedback signal. Usually, the added delay is sufficient to push the current positive feedback clock edge to the next positive reference clock edge. Such an implementation may, at times, require the addition of nearly a full clock period of delay when the positive edge of the feedback signal slightly trails the positive edge of the reference signal. Increasing the delay added to the feedback signal increases the jitter present in the power supply. Thus, DDR IO incurs power supply sensitivity issues as delay units are added to the feedback signal.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 3A illustrates an example timing diagram in which a leading edge of a pulse in a reference clock signal is aligned with a leading edge of a pulse in a feedback signal and a leading edge of a pulse in an inverted feedback signal, in accordance with at least one embodiment of the present disclosure;

Figure 1:
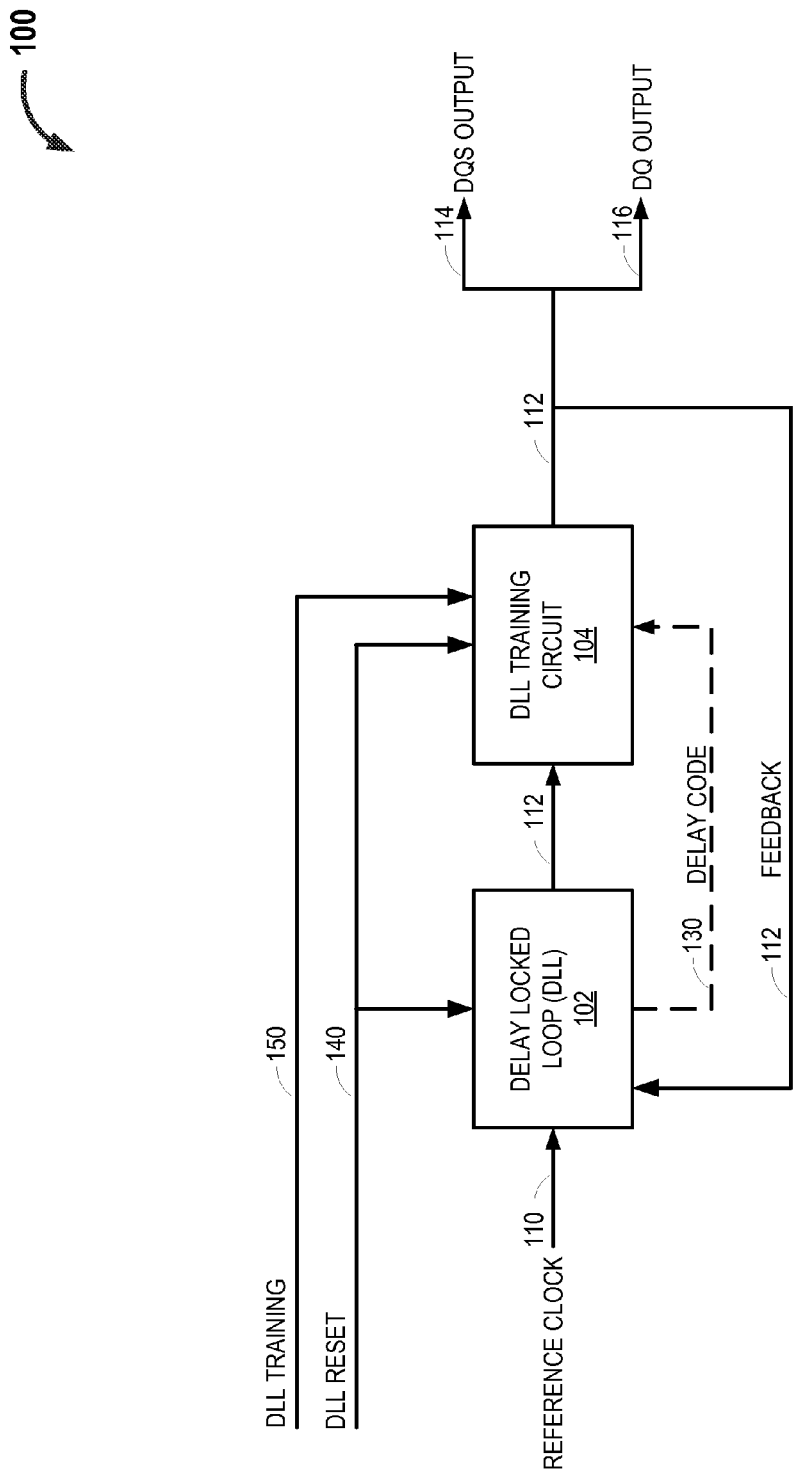
FIG. 1 illustrates an example system that includes a delay-locked loop and a DLL training circuit, in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

Delay-locked loops (DLLs) align the leading edge of a feedback signal with a leading edge of a clock signal by adding delay to the feedback signal. Such leading edge to leading edge alignment may require the addition of almost a full clock period of delay when the leading edge of the feedback signal occurs just after the leading edge of the reference clock signal. Using both the positive edge of the feedback signal and the negative edge of the feedback signal reduces the maximum amount of delay required to less than one half the period of the reference clock signal. In implementations, aligning the negative edge of the feedback signal with the positive edge of the reference clock signal may be achieved by placing the DLL in a training mode in which the delay calculated by the DLL is not supplied to the DLL delay chain. Once placed in a training mode, the DLL determines a first delay loop value corresponding to the delay needed to achieve alignment of the leading edge of the feedback signal with the leading edge of the reference clock signal. Similarly, in the training mode, the feedback signal is inverted to produce an inverted feedback signal provided to the DLL. Using the inverted feedback signal, the DLL determines a second delay loop value corresponding to the delay needed to achieve alignment of a leading edge of a pulse in the inverted feedback signal (i.e., the trailing edge of the feedback signal) with the leading edge of a pules in the reference clock signal. The DLL then loads the smaller of the first delay loop value or the second delay loop value into the delay chain. If the first delay loop value is the lesser of the two values, the DLL will align the leading edge of a pulse in the feedback signal with a leading edge of a pulse in the reference clock signal. If the second delay loop value is the lesser of the two values, the DLL will align the trailing edge of a pulse in the feedback signal (i.e., the leading edge of a pulse in the inverted feedback signal) with a leading edge of a pulse in the reference clock signal.

A system to reduce power supply sensitivity includes a multiplexer to receive a feedback signal and an inverted feedback signal. The system also includes a delay-locked loop (DLL) communicably coupled to the multiplexer. The DLL receives the feedback signal from the multiplexer and determine a first delay code value corresponding to a quantity of delay added to a DLL delay chain to cause alignment of a leading edge of a pulse in the feedback signal with a leading edge of a pulse in a reference clock signal. The DLL further receives the inverted feedback signal from the multiplexer and determine a second delay code value corresponding to a quantity of delay added to a DLL delay chain to cause alignment of a leading edge of a pulse in the inverted feedback signal with a leading edge of a pulse in a reference clock signal. The system also includes a DLL training circuit communicably coupled to the multiplexer and the DLL. The DLL training circuit receives the first delay code value and the second delay code value from the DLL and causes the DLL to selectively transfer a delay corresponding to a smaller temporal interval of the first delay code value or the second delay code value to the DLL delay chain.

A method of reducing power supply sensitivity includes receiving at a multiplexer, a feedback signal and an inverted feedback signal. The method also includes receiving, by a delay-locked loop (DLL), a reference clock signal. The method further includes receiving, by the DLL, the feedback signal from the multiplexer and determining a first delay code value corresponding to a quantity of delay added to a DLL delay chain to align a leading edge of a pulse in the feedback signal with a leading edge of a pulse in the reference clock signal. The method additionally includes receiving, by the DLL, the inverted feedback signal from the multiplexer and determining a second delay code value corresponding to a quantity of delay added to the DLL delay chain to align a leading edge of a pulse in the inverted feedback signal with a leading edge of a pulse in the reference clock signal. The method includes receiving, by a DLL training circuit communicably coupled to the DLL and the multiplexer, the first delay code value and the second delay code value and causing the DLL to selectively load into the DLL delay chain the smaller of the first delay code value or the second delay code value.

A storage device can include one or more machine-executable instruction sets that, when executed by a DLL training circuit, reduce power supply sensitivity. The DLL training circuit provides a feedback signal and an inverted feedback signal to a multiplexer. The DLL training circuit further provides a reference clock signal to a delay-locked loop (DLL). The DLL training circuit also transmits the feedback signal from the multiplexer to the DLL and causes the DLL to determine a first delay code value corresponding to a quantity of delay added to a DLL delay chain to align a leading edge of a pulse in the feedback signal with a leading edge of a pulse in the reference clock signal. The DLL training circuit transmits the inverted feedback signal to the DLL and causes the DLL to determine a second delay code value corresponding to a quantity of delay added to the DLL delay chain to align a leading edge of a pulse in the inverted feedback signal with a leading edge of a pulse in the reference clock signal. The DLL training circuit receives the first delay code value and the second delay code value and causes the DLL to selectively transfer to the DLL delay chain the smaller of the first delay code value or the second delay code value.

FIG. 1 illustrates an example DLL training system 100 for reducing the duration of a DLL delay code inserted into a reference clock signal 110 thereby reducing the jitter introduced to a communicably coupled power supply, in accordance with one or more aspects of the present disclosure. The system 100 includes a delay-locked loop (DLL) 102 and a DLL training circuit 104, which although depicted as separate elements in FIG. 1, may be combined into a single element. The DLL 102 compares the phase of the reference clock signal 110 with the phase of a feedback signal 112. Based on the differential between the reference clock signal 110 and the feedback signal 112, the DLL inserts a delay code 130 into the feedback signal to synchronize the phase of the reference clock signal 110 with the phase of the feedback signal 112. Dependent upon the degree of synchronization between the reference clock signal 110 and the feedback signal 112, the delay code 130 can be as little as zero (e.g., when the reference clock signal 110 is synchronized with the feedback signal 112) or as much as slightly less than the period of the reference clock signal 110 (e.g., when reference clock signal 110 and the feedback signal 112 display only a slight phase difference).

The feedback signal 112 can be used to synchronize devices within a system to the reference clock 110. Such synchronization permits reliable data transfer between system components. For example, as depicted in FIG. 1, a double data rate (DDR) input output (IO) device may generate a DQS (data strobe) 114 and DQS (data transfer) signal 116 using feedback signal 112.

In implementations, a reset signal 140 is provided to the DLL 102 and the DLL training circuit 104. The DLL training circuit 104 receives a training enable signal 150 that causes the DLL training circuit 104 to enter a training mode in which the feedback signal 112 is provided to the DLL 102 at a first time. Responsive to the receipt of the feedback signal 112, the DLL generates a first delay code value (e.g., coarse delay code+fine delay code) corresponding to the quantity of delay added to the feedback signal 112 to align a positive transition (e.g., a logic state transition corresponding to a leading edge of a pulse—a LOW to HIGH logic state transition) in the feedback signal 112 with a positive transition in the reference clock signal 110. The DLL communicates the first delay code value 130a to the DLL training circuit 104 where the value may be stored in a memory or similar storage device.

The training mode further causes the DLL training circuit 104 to invert the feedback signal 112 and communicate the inverted feedback signal 112 to the DLL 102 at a second time. Note that in the inverted feedback signal 112, positive transitions (e.g., LOW to HIGH logic state transitions indicative of a leading edge of a pulse) in the inverted feedback signal correspond to negative transitions (e.g., HIGH to LOW logic state transitions indicative of a trailing edge of a pulse) in the feedback signal). Responsive to the receipt of the inverted feedback signal 112, the DLL generates a second delay code value (e.g., coarse delay code+fine delay code) corresponding to the quantity of delay added to the inverted feedback signal 112 to align a positive transition in the inverted feedback signal 112 with a positive transition in the reference clock signal 110. The DLL communicates the second delay code value 130b to the DLL training circuit 104 where the value may be stored in a memory or similar storage device.

The DLL training circuit 104 selects the delay code value corresponding to the shortest time delay. After selecting the delay code value, the DLL training module instructs the DLL to insert the corresponding delay code into the feedback signal. By introducing the least possible delay into the feedback signal, power supply stability is increased.

Figure 2:
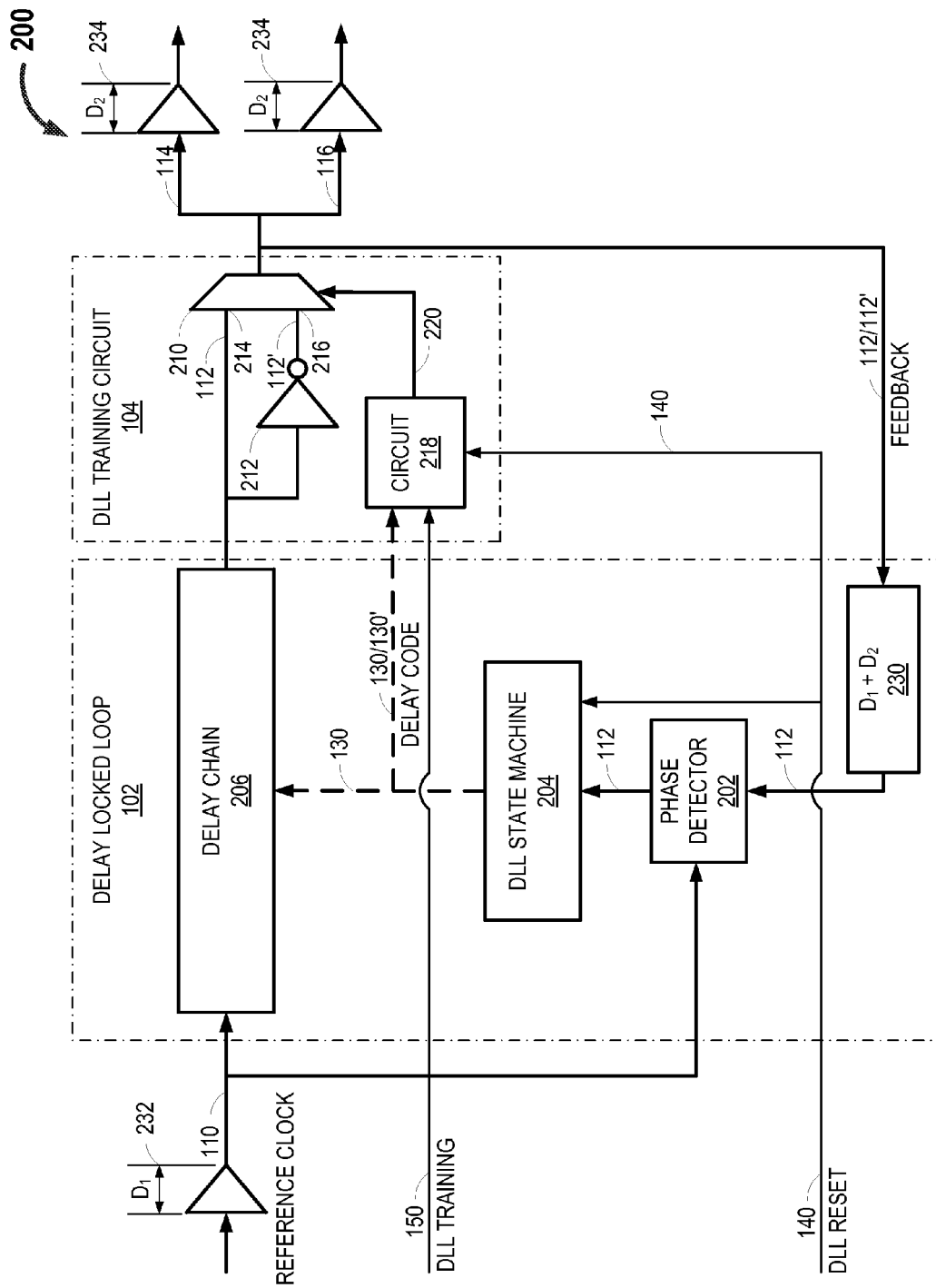
FIG. 2 illustrates an example system that includes a DLL and a DLL training circuit, in accordance with at least one embodiment of the present disclosure.

FIG. 2. Illustrates an example DLL training system 200 for reducing the duration of a DLL delay code inserted into a reference clock signal 110 thereby reducing the jitter introduced to a communicably coupled power supply, in accordance with one or more aspects of the present disclosure. FIG. 2 illustrates a number of components included in the DLL 102 and the DLL training circuit 104. In some instances, the DLL 102 can include one or more phase detectors 202, one or more DLL state machines 204, and one or more elements for introducing delay into the feedback signal 112, for example a delay chain 206. In some instances, the DLL training circuit 104 can include one or more multiplexers 210, one or more inverters 212, and a circuit 218 that receives the delay code values 130 from the DLL 102 and provides one or more outputs to the multiplexer 210. The feedback signal 112 is provided to a first multiplexer input 214 and the inverted feedback signal 112' is provided to a second multiplexer input 216. At the direction of the circuit 218, the multiplexer can output the feedback signal 112 or the inverted feedback signal 112'. Although depicted as separate modules in FIG. 2, at times, some or all of the multiplexer 210, inverter 212, and circuit 218 may be incorporated in whole or in part into the DLL 102.

In operation, the training enable signal 150 is provided to the circuit 218. Responsive to receiving the training enable signal 150, at a first time the circuit 218 causes the multiplexer 210 to output the feedback signal 112 to the DLL 102. The phase detector 202 compares the phase of the reference clock signal 110 with the phase of the feedback signal 112. The DLL state machine 204 determines the quantity of delay sufficient to align a positive transition of a pulse in the feedback signal 112 with a positive transition of a pulse in the reference clock signal 110. The DLL state machine outputs the quantity of delay to add to the feedback signal 112 as a first delay code value 130 which is received by the circuit 218.

At a second time, the circuit 218 causes the multiplexer 210 to output the inverted feedback signal 112' to the DLL 102. The phase detector 202 compares the phase of the reference clock signal 110 with the phase of the inverted feedback signal 112'. The DLL state machine 204 determines the quantity of delay sufficient to align a positive transition of a pulse in the inverted feedback signal 112' with a positive transition of a pulse in the reference clock signal 110. The DLL state machine outputs the quantity of delay to add to the feedback signal 112 as the second delay code value 130' which is received by the circuit 218.

Still in training mode, the circuit 218 may compare the temporal delay corresponding to the first delay code value 130 (delay added to feedback signal to align with reference clock signal) with the temporal delay corresponding to the second delay code value 130' (delay added to inverted feedback signal to align with reference clock signal). The circuit 218 selects the delay code 130 or 130' corresponding to the lesser temporal delay. In embodiments, the DLL state machine 204 adds the delay code 130 or 130' selected by the circuit 218 as corresponding to the lesser temporal delay. Selection of the first delay code value 130 aligns the leading edge of a pulse in the feedback signal 112 with the leading edge of a pulse in the reference clock signal 110. Selection of the second delay code value 130' aligns the trailing edge of a pulse in the feedback signal 112 with the leading edge of a pulse in the reference clock signal 110.

In some implementations, the DLL 102 may include a delay module 230 that adds a quantity of delay to the feedback signal 112 to compensate for delays caused by external system components. Such delays may include, for example, a delay 232 in the reference clock signal 110 or delays 234 in outputs such as a delay in the DQ/DQS output produced by a DDR IO module. Including such delays in the feedback signal 112 may improve the accuracy of the first delay code value 130 and the second delay code value 130' for timing signals observed remote from the DLL 102.

The DLL state machine 204 can include any number or combination of systems, devices, modules, or components sufficient to at least receive the output from the phase detector 202 and determine a delay code corresponding to a temporal delay added to the feedback signal 112 to align the feedback signal 112 with the reference clock signal 110. The DLL state machine 204 may, at times, include or have access to one or more storage devices to store or otherwise retain one or more machine-readable instruction sets that are executable by the DLL state machine 204. The DLL state machine 204 may include one or more digital signal processors, one or more controllers, one or more microcontrollers, one or more single or multiple core processors, one or more reduced instruction set computers (RISCs), one or more field programmable gate arrays (FPGAs), or combinations thereof.

The delay chain 206 can include any number or combination of systems, devices, modules, or components sufficient to at least receive the delay code value 130 from the DLL state machine 204 and add a corresponding amount of delay into the feedback signal 112 such that the feedback signal 112 aligns with the reference clock signal. The delay chain 206 may include, for example, a voltage controlled delay line.

The circuit 218 can include any number or combination of systems, devices, modules, or components sufficient to at least receive the delay code 130 and 130', the reset signal 140, and the training enable signal 150, output a control signal to the multiplexer 210, and select the delay code value 130 or 130' corresponding to the smaller temporal delay. The circuit 218 may, at times, include or have access to one or more storage devices to store or otherwise retain one or more machine-readable instruction sets that are executable by the circuit 218. The circuit 218 may include one or more digital signal processors, one or more controllers, one or more microcontrollers, one or more single or multiple core processors, one or more reduced instruction set computers (RISCs), one or more field programmable gate arrays (FPGAs), or combinations thereof.

FIG. 3A depicts a timing diagram 300 depicting an example reference clock signal 110, an example feedback signal 112, and an example inverted feedback signal 112', in accordance with one or more aspects of the present disclosure. The reference clock signal 110 has a period 302 that includes a first interval 304 during which the reference clock signal 110 is in a second logic state 307 (e.g., the HIGH logic state) and a second interval 306 during which the reference clock signal 110 is in a first logic state 305 (e.g., the LOW logic state). The feedback signal 112 has a period 320 that includes a first interval 322 during which the feedback signal 112 is in a second logic state 307 (e.g., the HIGH logic state) and a second interval 324 during which the feedback signal 112 is in a first logic state 305 (e.g., the LOW logic state). The inverted feedback signal 112' also has a period 320 that includes a first interval 324 during which the inverted feedback signal 112' is in the first logic state 305 (e.g., the LOW logic state) and a second interval 322 during which the inverted feedback signal 112' is in a second logic state 307 (e.g., the HIGH logic state). At times, the period 302 and intervals 304, 306 of the reference clock signal 110 may be the same as the period 320 and intervals 322, 324 of the feedback signal 112 and inverted feedback signal 112'. At other times, the period 302 and intervals 304, 306 of the reference clock signal 110 may be different from the period 320 and intervals 322, 324 of the feedback signal 112 and inverted feedback signal 112'.

In the training mode, at the first time, the DLL training circuit 104 may return the feedback signal 112 to return to the DLL 102. The DLL 102 determines the first delay code value 130 that corresponds to the quantity of temporal delay 330 to align the leading edge 326 of the feedback signal 112 with the leading edge 308 of the reference clock signal 110.

In the training mode, at the second time, the DLL training circuit 104 may return the inverted feedback signal 112' to return to the DLL 102. The DLL 102 determines the second delay code value 130' that corresponds to the quantity of temporal delay 340 added to the inverted feedback signal 112' to align the leading edge 326 of the inverted feedback signal 112' with the leading edge of the reference clock signal 110.

The DLL training circuit 104 compares the first delay code value 130 with the second delay code value 130' and selects the delay code value corresponding to the lesser temporal interval. In the example depicted in FIG. 3A, the DLL training circuit 104 would select the first delay code value 130 because interval 330 is temporally shorter or less than interval 340. The DLL training circuit 104 causes the DLL 102 to add the delay code corresponding to the first delay code value 130 to the feedback signal 112. Adding the delay code corresponding to the first delay code value 130 to the feedback signal 112 causes the leading edge 326 of the feedback signal 112 to align with the leading edge 308 of the reference clock signal 110.

Figure 3B:
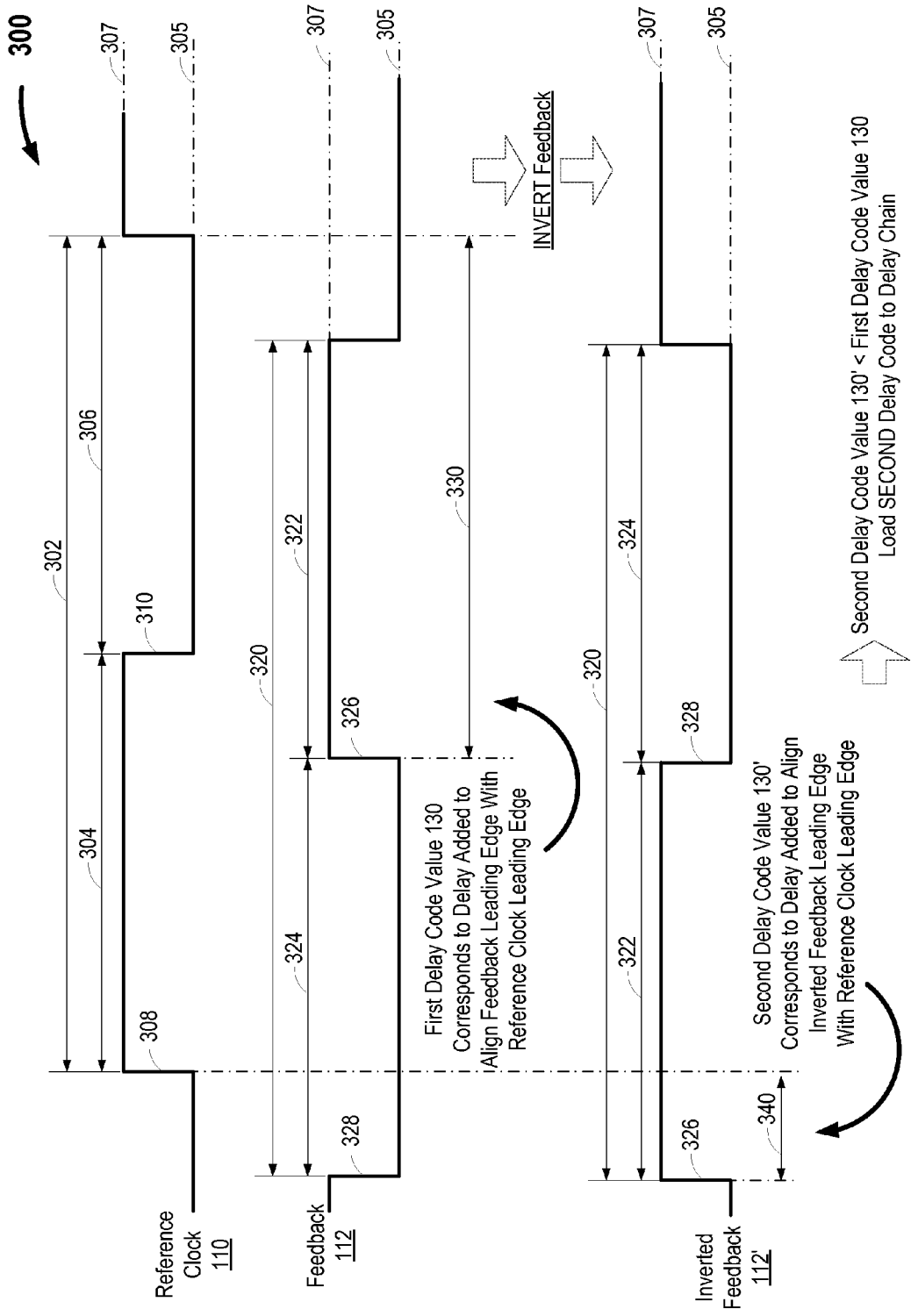
FIG. 3B illustrates another example timing diagram in which a leading edge of a pulse in a reference clock signal is aligned with a leading edge of a pulse in a feedback signal and a leading edge of a pulse in an inverted feedback signal, in accordance with at least one embodiment of the present disclosure.

FIG. 3B depicts another timing diagram 300 depicting an example reference clock signal 110, an example feedback signal 112, and an example inverted feedback signal 112', in accordance with one or more aspects of the present disclosure.

In the training mode, at the first time, the DLL training circuit 104 may return the feedback signal 112 to return to the DLL 102. The DLL 102 determines the first delay code value 130 that corresponds to the quantity of temporal delay 330 to align the leading edge 326 of the feedback signal 112 with the leading edge 308 of the reference clock signal 110.

In the training mode, at the second time, the DLL training circuit 104 may return the inverted feedback signal 112' to return to the DLL 102. The DLL 102 determines the second delay code value 130' that corresponds to the quantity of temporal delay 340 added to the inverted feedback signal 112' to align the leading edge 326 of the inverted feedback signal 112' with the leading edge of the reference clock signal 110.

The DLL training circuit 104 compares the first delay code value 130 with the second delay code value 130' and selects the delay code value corresponding to the lesser temporal interval. In the example depicted in FIG. 3B, the DLL training circuit 104 would select the second delay code value 130' because interval 340 is temporally shorter or less than interval 330. The DLL training circuit 104 causes the DLL 102 to add the delay code corresponding to the second delay code value 130' to the feedback signal 112. Adding the delay code corresponding to the second delay code value 130' to the feedback signal 112 causes the trailing edge 328 of the feedback signal 112 to align with the leading edge 308 of the reference clock signal 110.

Figure 4:
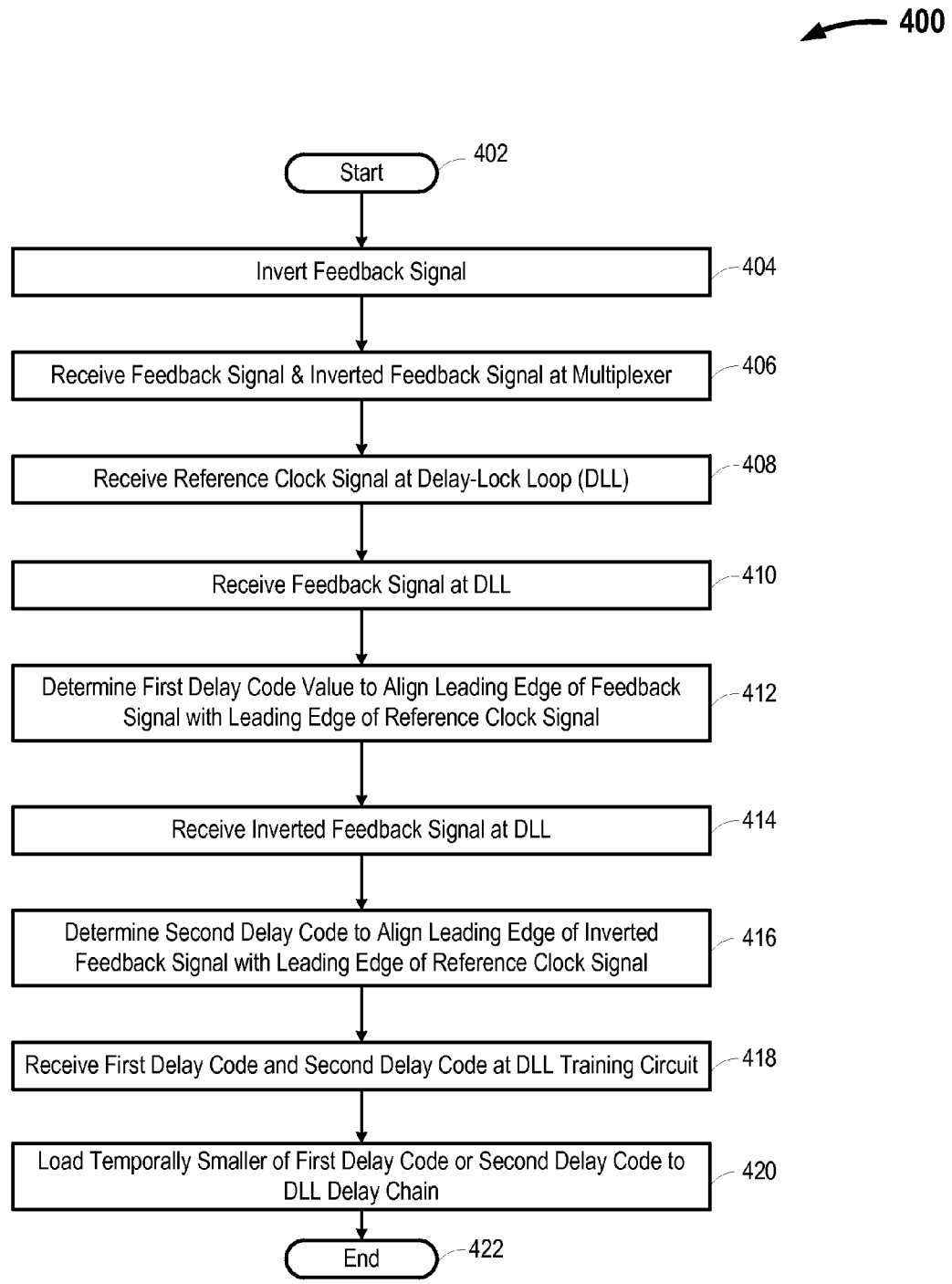
FIG. 4 illustrates an example high-level method of training a DLL using a reference clock signal, a feedback signal, and an inverted feedback signal, in accordance with at least one embodiment of the present disclosure.

FIG. 4 depicts a high-level flow diagram of an illustrative method 400 for determining the minimum amount of delay to add to a feedback signal 112 to cause the signal to align with a reference clock signal 110 and minimize the amount of jitter in a communicably coupled power supply, in accordance with one or more aspects of the present disclosure. Placing a DLL training circuit 104 into a training mode may cause the DLL training circuit 104 to return a feedback signal 112 to a DLL 102. Upon receiving the feedback signal 112, the DLL 102 determines a first delay code value 130 corresponding to a quantity of temporal delay added to the feedback signal 112 to align a logic state transition in the feedback signal 112 with a logic state transition in the reference clock signal 110. Placing a DLL training circuit 104 into a training mode may additionally cause the DLL training circuit 104 to return an inverted feedback signal 112' to a DLL 102. Upon receiving the inverted feedback signal 112', the DLL 102 determines a second delay code value 130' corresponding to a quantity of temporal delay added to the inverted feedback signal 112' to align a logic state transition in the inverted feedback signal 112' with a logic state transition in the reference clock signal 110. The DLL training circuit 104 can cause the DLL 102 to add the temporally lesser of the first delay code value 130 or the second delay code value 130' into the feedback signal 112, thereby aligning a logic state transition in the feedback signal 112 with a logic state transition in the reference clock signal 110. The method 400 commences at 402.

At 404, the feedback signal 112 is inverted to provide an inverted feedback signal 112'. In some implementations, one or more inverters 212 may be used to invert the feedback signal 112. The one or more inverters 212 may be included in the DLL 102 or may be separate from the DLL 102.

At 406, the feedback signal 112 is received at a first multiplexer input 214 and the inverted feedback signal 112' is received at a second multiplexer input 216. The multiplexer 210 may be included in the DLL 102 or may be separate from the DLL 102.

At 408, the DLL receives the reference clock signal 110.

At 410, the DLL training circuit 104 causes the multiplexer 210 to output the feedback signal 112. The outputted feedback signal 112 is received by the DLL 102.

At 412, the DLL 102 determines the first delay code value 130 corresponding to the amount of temporal delay added to the feedback signal 112 to align a logic state transition (i.e., a leading edge 326) of the feedback signal 112 with a logic state transition (i.e., a leading edge 308) of the reference clock signal 110.

At 414, the DLL training circuit 104 causes the multiplexer 210 to transmit the inverted feedback signal 112' to the DLL 102. At times, the inverted feedback signal 112' is received by the DLL state machine 204.

At 416, the DLL 102 determines the second delay code value 130' corresponding to the amount of temporal delay added to the inverted feedback signal 112' to align a logic state transition (i.e., a leading edge 326) of the inverted feedback signal 112' with a logic state transition (i.e., a leading edge 308) of the reference clock signal 110. Note that aligning a leading edge 326 of the inverted feedback signal 112' with a leading edge 308 of the reference clock signal 110 causes alignment of a trailing edge 328 of the feedback signal 112 with the leading edge 308 of the reference clock signal 110.

At 418, the DLL training circuit 104 receives the first delay code value 130 and the second delay code value 130'.

At 420, the DLL training circuit 104 causes the DLL 102 to add the temporally smaller of the first delay code value 130 or the second delay code value 130' to the feedback signal 112. This causes an alignment of a logic state transition (either a leading edge 326 or a trailing edge 328) of the feedback signal 112 with a logic state transition (a leading edge 308) of the reference clock signal 110. The method 400 concludes at 422.

Figure 5:
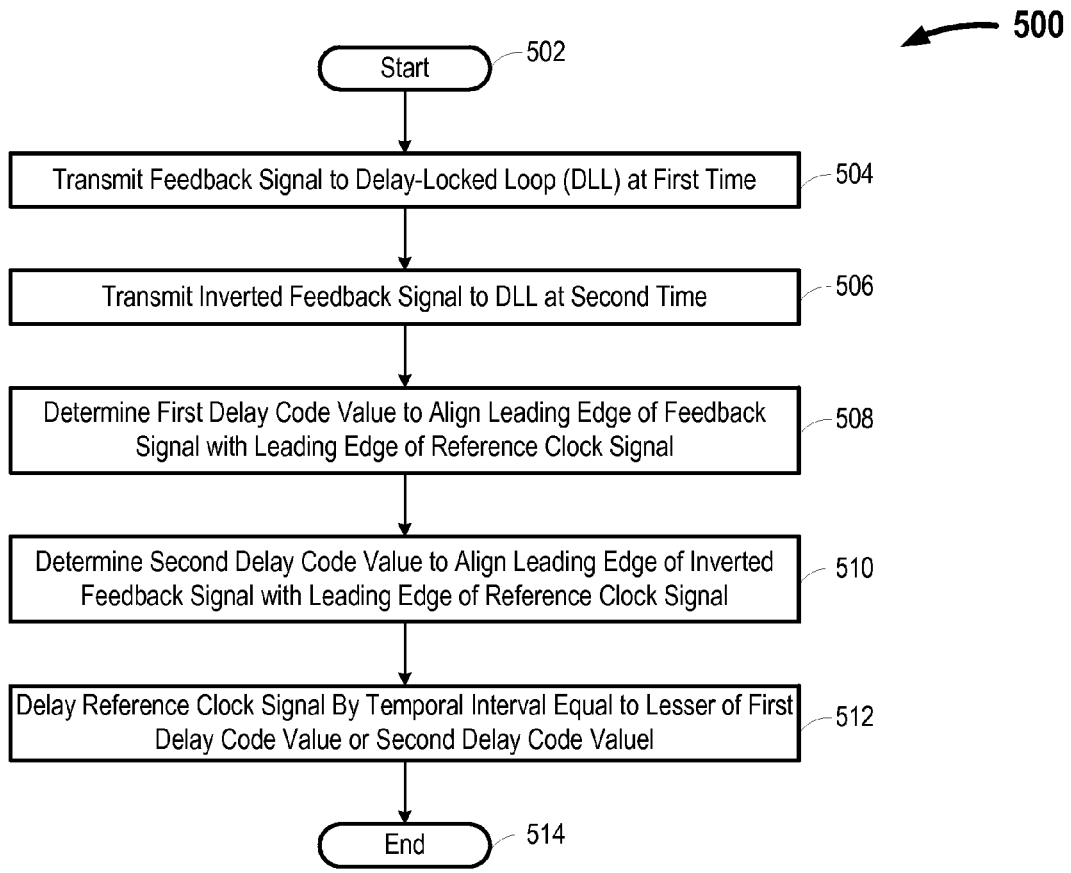
FIG. 5 illustrates another example high-level method of training a DLL using a reference clock signal, a feedback signal, and an inverted feedback signal, in accordance with at least one embodiment of the present disclosure.

FIG. 5 depicts a high-level logic flow diagram of an example method 500 of a DLL training method that may be used stand-alone or in conjunction with the method 400, in accordance with one or more aspects of the present disclosure. In some instances, the DLL training circuit 104 causes the transmission of the feedback signal 112 to the DLL 102 at a first time and the transmission of the inverted feedback signal 112' to the DLL at a second time. The second time may occur before or after the first time. The method 500 commences at 502.

At 504, the DLL training circuit 104 causes the transmission of the feedback signal 112 to the DLL 102 at the first time. In some implementations, the DLL training circuit 104 provides an output signal to the multiplexer 210 to cause the transmission of the feedback signal 112 to the DLL 102 at the first time.

At 506, the DLL training circuit 104 causes the transmission of the inverted feedback signal 112' to the DLL 102 at the second time. In some implementations, the DLL training circuit 104 provides an output signal to the multiplexer 210 to cause the transmission of the inverted feedback signal 112' to the DLL 102 at the second time.

At 508, the DLL 102 determines the first delay code value 130 corresponding to the delay added to the feedback signal 112 to align a leading edge in the feedback signal 112 with a leading edge in the reference clock signal 110. In some implementations, the DLL state machine 204 generates the first delay code value 130. At times, the first delay code value 130 may be stored in a storage device resident in or communicably coupled to the DLL 102. At other times, the first delay code value 130 may be stored in a storage device resident in or communicably coupled to the DLL training circuit 104.

At 510, the DLL 102 determines the second delay code value 130' corresponding to the delay added to the inverted feedback signal 112' to align a leading edge in the inverted feedback signal 112' with a leading edge in the reference clock signal 110. In some implementations, the DLL state machine 204 generates the second delay code value 130'. At times, the second delay code value 130' may be stored in a storage device resident in or communicably coupled to the DLL 102. At other times, the second delay code value 130' may be stored in a storage device resident in or communicably coupled to the DLL training circuit 104.

At 512, the DLL training circuit 104 determines whether the first delay code value 130 or the second delay code value 130' corresponds to the smaller or lesser temporal delay. In some instances, the DLL 102 reads the first delay code value 130 and the second delay code value 130' from a storage device and transfers the first delay code value 130 and the second delay code value 130' to the DLL training circuit 104. In other instances, the DLL training circuit 104 reads the first delay code value 130 and the second delay code value 130' from a storage device resident in or communicably coupled to the DLL training circuit 104.

The DLL training circuit 104 may transmit a signal containing information indicative of the delay code value corresponding to the smaller temporal delay (e.g., the signal may contain information indicative of either "first" or "second" to designate to the DLL which delay code value to load into the delay chain). At times, the DLL training circuit 104 may transmit a signal containing information indicative of the actual delay code value itself (e.g., the signal may contain the actual first delay code value 130 or the second delay code value 130').

The DLL 102 adds the delay corresponding to the selected delay code to the feedback signal 112. At times, this causes the leading edge 326 of the feedback signal 112 to align with the leading edge 308 of the reference clock signal when the DLL 102 adds the delay corresponding to the first delay code value 130 to the feedback signal 112. At other times, this causes the trailing edge 328 of the feedback signal 112 to align with the leading edge 308 of the reference clock signal when the DLL 102 adds the delay corresponding to the second delay code value 130' to the feedback signal 112. The method 500 concludes at 514.

Figure 6:
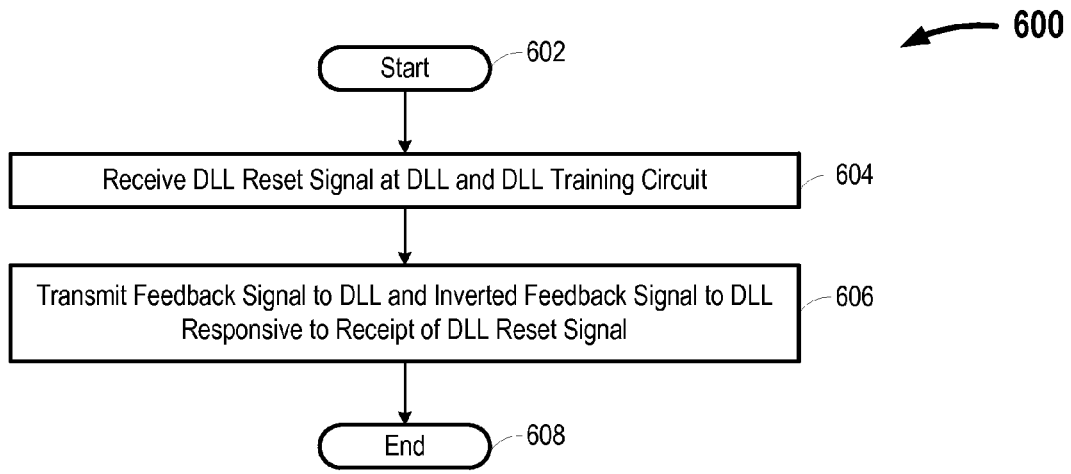
FIG. 6 illustrates an example high-level method of transmitting a feedback signal and an inverted feedback signal to a DLL in response to a DLL reset signal, in accordance with at least one embodiment of the present disclosure.

FIG. 6 depicts a high-level logic flow diagram of an example method 600 of training a DLL to reduce the delay added to the feedback signal 112, in accordance with one or more aspects of the present disclosure. The method 600 may be used stand-alone or in conjunction with one or more of the methods 400 and 500. At times, the DLL reset signal 140 may commence the determination of the first delay code value 130 and the second delay code value 130'. The method 600 commences at 602.

At 604, either or both the DLL 102 and the DLL training circuit 104 receive the DLL reset signal 140. In some implementations, either or both the DLL state machine 204 or the circuit 218 receive the DLL reset signal 140. The DLL reset signal 140 may be generated internally by the DLL 102 or may be generated external to the DLL and transmitted to the DLL 102 and the DLL training circuit 104. At times, the DLL reset signal 140 may be generated manually, for example in response to a system user input. At other times, the DLL reset signal 140 may be generated autonomously, for example on an intermittent, periodic, or aperiodic basis. At other times, the DLL reset signal 140 may be generated in response to an occurrence of one or more defined events, for example in response to a phase difference between the reference clock signal 110 and the feedback signal 112 exceeding a defined threshold.

At 606, responsive to the receipt of the DLL reset signal 140, the DLL training circuit 104 causes the transmission of the feedback signal 112 and the inverted feedback signal 112' to the DLL 102. The method 600 concludes at 608.

Figure 7:
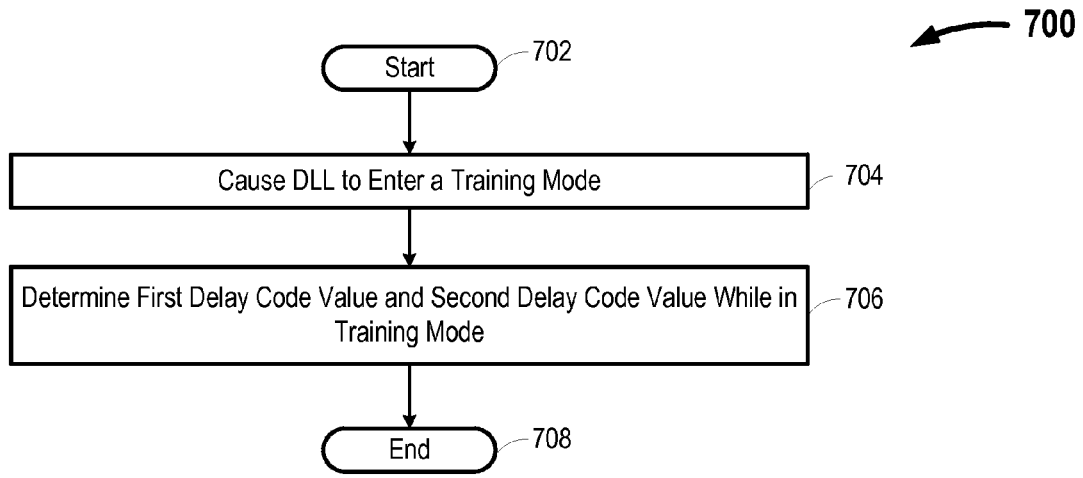
FIG. 7 illustrates an example high-level method of determining a first delay code value and a second delay code value in response to placing a DLL in a training mode, in accordance with at least one embodiment of the present disclosure.

FIG. 7 depicts a high-level logic flow diagram of an example method 700 of training a DLL to minimize the delay added to the feedback signal 112, in accordance with one or more aspects of the present disclosure. The method 700 may be used stand-alone or in conjunction with one or more of the methods 400, 500, and 600. At times, the DLL training enable signal 150 may cause the DLL 102 to enter a training mode and commence the determination of the first delay code value 130 and the second delay code value 130'. The method 700 commences at 702.

At 704, the DLL training circuit 104 receives the DLL training enable signal 150. In some implementations, the circuit 218 receives the DLL training enable signal 150. The DLL training enable signal 150 may be generated internally by the DLL 102 or may be generated externally and transmitted to the DLL training circuit 104. At times, the DLL training enable signal 150 may be generated manually, for example in response to a system user input. At other times, the DLL training enable signal 150 may be generated autonomously, for example on an intermittent, periodic, or aperiodic basis. At other times, the DLL training enable signal 150 may be generated in response to an occurrence of one or more defined events, for example in response to a phase difference between the reference clock signal 110 and the feedback signal 112 exceeding a defined threshold.

At times, the DLL training signal 150 is transmitted to the DLL 102 and causes the DLL 102 to enter and remain in the training mode until the DLL training enable signal 150 is transmitted to the DLL 102 again. At other times, the DLL training enable signal 150 maintains the DLL 102 in the training mode at all times while the DLL training signal 150 is present. At such times, removal of the DLL training signal 150 causes the DLL 102 to exit the training mode.

At 706, responsive to the receipt of the DLL training enable signal 150, the DLL training circuit 104 causes the determination of the first delay code value 130 and the second delay code value 130' by the DLL 102 without causing the DLL to add the delay corresponding to the first delay code value 130 or the second delay code value 130' to the feedback signal 112. At times, upon receipt of the DLL training enable signal 150, the DLL 102 does not correct phase alignment between the reference clock signal 110 and the feedback signal 112 until the DLL training enable signal 150 is interrupted. The method 700 concludes at 708.

Figure 8:
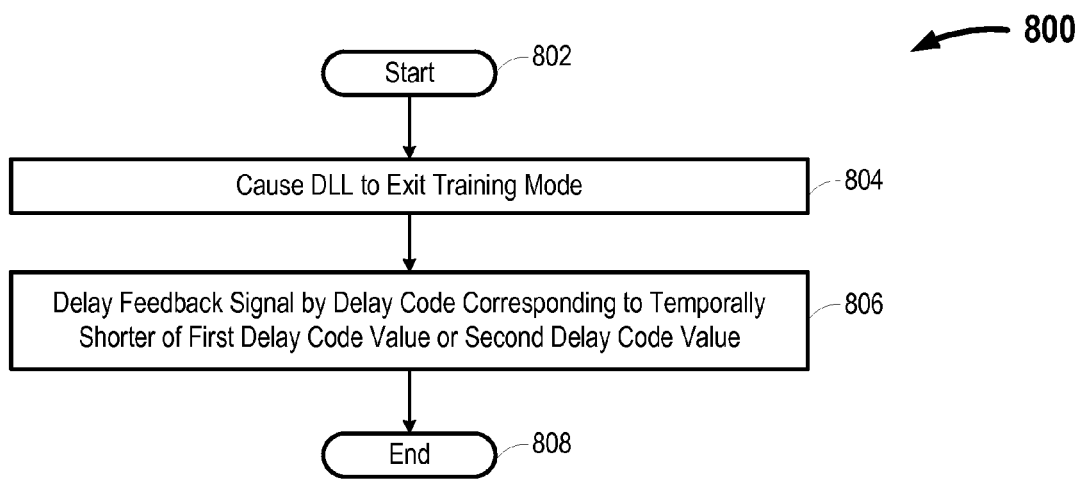
FIG. 8 illustrates an example high-level method of providing a DLL code update that delays a reference clock signal by the lesser of the first delay code value or the second delay code value, in accordance with at least one embodiment of the present disclosure.

FIG. 8 depicts a high-level logic flow diagram of an example method 800 of training a DLL to minimize the delay added to the feedback signal 112, in accordance with one or more aspects of the present disclosure. The method 800 may be used stand-alone or in conjunction with one or more of the methods 400, 500, 600, and 700. At times, the DLL training circuit 104 causes the DLL 102 to delay the feedback signal 112 by the delay code corresponding to the temporally shorter, smaller, or lesser of the first delay code value 130 or the second delay code value 130'. The method 800 commences at 802.

At 804, the DLL 102 exits the training mode. At times, the DLL training signal 150 is transmitted to the DLL 102 and causes the DLL 102 to enter and remain in the training mode until the DLL training enable signal 150 is transmitted to the DLL 102 again. At other times, the DLL training signal 150 maintains the DLL 102 in the training mode at all times while the DLL training signal 150 is present. At such times, removal of the DLL training signal 150 causes the DLL 102 to exit the training mode.

At 806, the DLL 102 adds the delay corresponding to the selected delay code to the feedback signal 112. At times, this causes the leading edge 326 of the feedback signal 112 to align with the leading edge 308 of the reference clock signal when the DLL 102 adds the delay corresponding to the first delay code value 130 to the feedback signal 112. At other times, this causes the trailing edge 328 of the feedback signal 112 to align with the leading edge 308 of the reference clock signal when the DLL 102 adds the delay corresponding to the second delay code value 130' to the feedback signal 112. The method 800 concludes at 808.

The following examples pertain to further embodiments. The following examples of the present disclosure may comprise subject material such as a device, a method, at least one machine-readable medium for storing instructions that when executed cause a machine to perform acts based on the method, means for performing acts based on the method and/or a system for binding a trusted input session to a trusted output session to prevent the reuse of encrypted data obtained from prior trusted output sessions.

According to example 1 there is provided a system to reduce power supply sensitivity. The system includes a multiplexer to receive a feedback signal and an inverted feedback signal and a delay-locked loop (DLL) communicably coupled to the multiplexer. The DLL may receive the feedback signal from the multiplexer and determine a first delay code value corresponding to a quantity of delay added to a DLL delay chain to cause alignment of a leading edge of a pulse in the feedback signal with a leading edge of a pulse in a reference clock signal. The DLL may further receive the inverted feedback signal from the multiplexer and determine a second delay code value corresponding to a quantity of delay added to a DLL delay chain to cause alignment of a leading edge of a pulse in the inverted feedback signal with a leading edge of a pulse in a reference clock signal. The system may further include a DLL training circuit communicably coupled to the multiplexer and the DLL. The DLL training circuit may receive the first delay code value and the second delay code value from the DLL and cause the DLL to selectively transfer a delay corresponding to a smaller temporal interval of the first delay code value or the second delay code value to the DLL delay chain.

Example 2 may include elements of example 1 and may additionally include an inverter communicably coupled to the multiplexer, the inverter to invert the feedback signal and provide the inverted feedback signal.

Example 3 may include elements of example 1 and the DLL training circuit may further cause the multiplexer to communicate the feedback signal to the DLL at a first time and the inverted feedback signal to the DLL at a second time.

Example 4 may include elements of example 3 and the DLL training circuit may further cause the multiplexer to communicate the feedback signal to the DLL at a first time responsive to receipt of a DLL reset signal.

Example 5 may include elements of example 1 and the DLL training circuit may further cause the DLL to enter a training mode in which the DLL determines the first delay code value and the second delay code value but does not transfer either of the first delay code value or the second delay code value to the DLL delay chain.

Example 6 may include elements of example 5 and the DLL training circuit may further cause the DLL to exit the training mode and transfer the smaller temporal value of either the first delay code or the second delay code to the DLL delay chain responsive to exiting the training mode.

According to example 7 there is provided a method of reducing power supply sensitivity. The method may include receiving at a multiplexer, a feedback signal and an inverted feedback signal. The method may further include receiving, by a delay-locked loop (DLL), a reference clock signal. The method may additionally include receiving, by the DLL, the feedback signal from the multiplexer and determining a first delay code value corresponding to a quantity of delay added to a DLL delay chain to align a leading edge of a pulse in the feedback signal with a leading edge of a pulse in the reference clock signal. The method may further include receiving, by the DLL, the inverted feedback signal from the multiplexer and determining a second delay code value corresponding to a quantity of delay added to the DLL delay chain to align a leading edge of a pulse in the inverted feedback signal with a leading edge of a pulse in the reference clock signal. The method may also include receiving, by a DLL training circuit communicably coupled to the DLL and the multiplexer, the first delay code value and the second delay code value and causing, by the DLL training circuit, the DLL to selectively load into the DLL delay chain the smaller of the first delay code value or the second delay code value.

Example 8 may include elements of example 7 and may additionally include inverting the feedback signal, via an inverter communicably coupled to the multiplexer, to provide the inverted feedback signal.

Example 9 may include elements of any of example 7 or 8 where determining a first delay code value corresponding to a quantity of delay added to a DLL delay chain to align a leading edge of a pulse in the feedback signal with a leading edge of a pulse in the reference clock signal comprises determining, by the DLL, the first delay code value corresponding to a quantity of temporal delay added to the DLL delay chain to align the leading edge of the pulse in the feedback signal with the leading edge of the pulse in the reference clock signal.

Example 10 may include elements of example 9 where determining a second delay code value corresponding to a quantity of delay added to the DLL delay chain to align a leading edge of a pulse in the inverted feedback signal with a leading edge of a pulse in the reference clock signal comprises determining, by the DLL, the second delay code value corresponding to a quantity of temporal delay added to the DLL delay chain to align the leading edge of the pulse in the inverted feedback signal with the leading edge of the pulse in the reference clock signal.

Example 11 may include elements of any of examples 7 or 8 where receiving the feedback signal from the multiplexer comprises receiving, by the DLL, the feedback signal from the multiplexer at a first time.

Example 12 may include elements of example 11 where receiving the inverted feedback signal from the multiplexer comprises receiving, by the DLL, the inverted feedback signal from the multiplexer at a second time.

Example 13 may include elements of example 12 and may additionally include receiving, by the DLL training circuit, a DLL reset signal; and causing the multiplexer to communicate the feedback signal to the DLL at the first time and the inverted feedback signal to the DLL at the second time responsive to receipt of the DLL reset signal.

Example 14 may include elements of any of claim 7 or 8 and may additionally include causing, by the DLL training circuit, the DLL to enter a training mode in which the DLL determines the first delay code value and the second delay code value but does not transfer either of the first delay code value or the second delay code value to the DLL delay chain, prior to receiving the feedback signal and the inverted feedback signal from the multiplexer.

Example 15 may include elements of example 14 and may additionally include causing, by the DLL training circuit, the DLL to exit the training mode and transfer the smaller temporal value of either the first delay code or the second delay code to the DLL delay chain responsive to exiting the training mode.

According to example 16, there is provided a storage device that includes machine executable instruction sets that, when executed by a circuit, reduce power supply sensitivity. The machine executable instruction sets may cause the circuit to provide a feedback signal and an inverted feedback signal to a multiplexer and provide a reference clock signal to a delay-locked loop (DLL). The machine executable instruction sets may cause the circuit to transmit the feedback signal from the multiplexer to the DLL. The machine executable instruction sets may cause the circuit to cause the DLL to determine a first delay code value corresponding to a quantity of delay added to a DLL delay chain to align a leading edge of a pulse in the feedback signal with a leading edge of a pulse in the reference clock signal. The machine executable instruction sets may cause the circuit to cause the DLL to receive the first delay code value and the second delay code value; and cause the DLL to selectively transfer to the DLL delay chain the smaller of the first delay code value or the second delay code value.

Example 17 may include elements of example 16 and the machine executable instruction sets may cause the circuit to invert the feedback signal to provide the inverted feedback signal.

Example 18 may include elements of example 16 and the machine executable instruction sets may cause the circuit to transmit the feedback signal from the multiplexer to the DLL at a first time.

Example 19 may include elements of example 18 and the machine executable instruction sets may cause the circuit to transmit the inverted feedback signal from the multiplexer to the DLL at a second time.

Example 20 may include elements of example 18 and the machine executable instruction sets may cause the circuit to receive a DLL reset signal and may also cause the multiplexer to transmit the feedback signal to the DLL at the first time and the inverted feedback signal to the DLL at the second time responsive to receipt of the DLL reset signal.

Example 21 may include elements of example 18 and the machine executable instruction sets may cause the circuit to cause the DLL to enter a training mode in which the DLL determines the first delay code value and the second delay code value but does not transfer either of the first delay code value or the second delay code value to the DLL delay chain, prior to receiving the feedback signal and the inverted feedback signal from the multiplexer.

Example 22 may include elements of example 21 and the machine executable instruction sets may cause the circuit to cause the DLL to cause the DLL to exit the training mode and transfer the smaller temporal value of either the first delay code or the second delay code to the DLL delay chain responsive to exiting the training mode.

According to example 23, there is provided a system for reducing power supply sensitivity. The system may include a means for receiving a feedback signal and an inverted feedback signal. The system may also include a means for receiving a reference clock signal. The system may also include a means for transmitting the feedback signal to a delay-locked loop (DLL) and determining a first delay code value corresponding to a quantity of delay added to a DLL delay chain to align a leading edge of a pulse in the feedback signal with a leading edge of a pulse in the reference clock signal. The system may also include a means for transmitting the inverted feedback signal to the delay-locked loop (DLL) and determining a second delay code value corresponding to a quantity of delay added to the DLL delay chain to align a leading edge of a pulse in the inverted feedback signal with a leading edge of a pulse in the reference clock signal. The system may further include a means for transmitting the first delay code value and the second delay code value to a DLL training circuit and a means for selectively transferring the smaller of the first delay code value or the second delay code value to the DLL delay chain.

Example 24 may include elements of example 23 and may also include a means for causing the DLL to enter a training mode in which the DLL determines the first delay code value and the second delay code value but does not transfer either of the first delay code value or the second delay code value to the DLL delay chain, prior to receiving the feedback signal and the inverted feedback signal from the multiplexer.

Example 25 may include elements of example 24 and may also include a means for causing the DLL to exit the training mode and selectively transfer the smaller temporal value of either the first delay code or the second delay code to the DLL delay chain responsive to exiting the training mode.

According to example 26 there is provided a delay-locked loop (DLL) system. The DLL system may include a DLL to determine a first delay code value corresponding to a temporal interval between a leading edge of a pulse in a feedback signal and a leading edge of a pulse in a reference clock signal and determine a second delay code value corresponding to a temporal interval between a leading edge of a pulse in an inverted feedback signal with a leading edge of a pulse in the reference clock signal. The system may further include a DLL training circuit to cause a multiplexer to communicate the feedback signal to the DLL at a first time and communicate the inverted feedback signal to the DLL at a second time and cause the DLL to selectively transfer to a delay chain one of either the first delay code or the second delay code that corresponds to a smaller temporal value.

Example 27 may include elements of example 26 and the DLL may also include an inverter to invert the feedback signal and provide the inverted feedback signal.

According to example 28, there is provided a method of providing a delay locked loop (DLL) system. The method may include transmitting a feedback signal to a DLL at a first time. The method may further include transmitting an inverted feedback signal to the DLL at a second time. The method may additionally include determining, by the DLL, a first delay code value corresponding to a temporal interval between a leading edge of a pulse in a feedback signal and a leading edge of a pulse in a reference clock signal. The method may also include determining, by the DLL, a second delay code value corresponding to a temporal interval between a leading edge of a pulse in an inverted feedback signal and a leading edge of a pulse in the reference clock signal and selectively delaying the reference clock signal by a temporal interval equal to the lesser of the first delay code value or the second delay code value.

Example 29 may include elements of example 28 and may also include receiving a DLL reset signal and transmitting the feedback signal to the DLL at the first time and the inverted feedback signal to the DLL at the second time responsive to receiving the DLL reset signal.

Example 30 may include elements of example 28 and may also include causing the DLL to enter a training mode in which the DLL determines the first delay code value and the second delay code value and inhibiting the delay of the feedback signal while the DLL is in the training mode.

Example 31 may include elements of example 29 and may also include causing the DLL to exit the training mode and selectively delaying the feedback signal by the lesser of the smaller temporal interval of either the first delay code or the second delay code responsive to the DLL exiting the training mode.

According to example 32, there is provided a system for providing a delay locked loop (DLL). The system may include a means for transmitting a feedback signal to a DLL at a first time. The system may further include a means for transmitting an inverted feedback signal to the DLL at a second time. The system may also include a means for determining a first delay code value corresponding to a temporal interval between a leading edge of a pulse in a feedback signal and a leading edge of a pulse in a reference clock signal. The system may additionally include a means for determining, by the DLL, a second delay code value corresponding to a temporal interval between a leading edge of a pulse in an inverted feedback signal and a leading edge of a pulse in the reference clock signal and a means for selectively delaying the feedback signal by a temporal interval equal to the lesser of the first delay code value or the second delay code value.

Example 33 may include elements of example 32 and may additionally include a means for receiving a DLL reset signal and a means for transmitting the feedback signal to the DLL at the first time and the inverted feedback signal to the DLL at the second time responsive to receiving the DLL reset signal.

Example 34 may include elements of example 32 and may additionally include a means for causing the DLL to enter a training mode in which the DLL determines the first delay code value and the second delay code value and a means for inhibiting the delay of the feedback signal while the DLL is in the training mode.

Example 35 may include elements of example 34 and may additionally include a means for causing the DLL to exit the training mode and a means for selectively delaying the feedback signal by the lesser of the smaller temporal interval of either the first delay code or the second delay code responsive to the DLL exiting the training mode.

According to example 36, there is provided a storage device that includes machine executable instruction sets that, when executed by a circuit, reduces power supply sensitivity by causing the circuit to function as a DLL training circuit and transmit a feedback signal to a DLL at a first time. The machine-executable instructions may further cause the DLL training circuit to transmit an inverted feedback signal to the DLL at a second time. The machine-executable instructions may further cause the DLL training circuit to cause the DLL to determine a first delay code value corresponding to a temporal interval between a leading edge of a pulse in a feedback signal and a leading edge of a pulse in a reference clock signal. The machine-executable instructions may further cause the DLL training circuit to cause the DLL to determine a second delay code value corresponding to a temporal interval between a leading edge of a pulse in an inverted feedback signal and a leading edge of a pulse in the reference clock signal and selectively delay the reference clock signal by a temporal interval equal to the lesser of the first delay code value or the second delay code value.

Example 37 may include elements of example 36 and the machine-executable instruction sets may further cause the DLL training circuit to receive a DLL reset signal and transmit the feedback signal to the DLL at the first time and the inverted feedback signal to the DLL at the second time responsive to receiving the DLL reset signal.

Example 38 may include elements of example 36 and the machine-executable instruction sets may further cause the DLL training circuit to cause the DLL to enter a training mode in which the DLL determines the first delay code value and the second delay code value and inhibit the delay of the feedback signal while the DLL is in the training mode.

Example 39 may include elements of example 38 and the machine-executable instruction sets may further cause the DLL training circuit to cause the DLL to exit the training mode and selectively delay the feedback signal by the lesser of the smaller temporal interval of either the first delay code or the second delay code responsive to the DLL exiting the training mode.

According to example 40, there is provided a system for provision of supporting content including at least a device, the system being arranged to perform the method of any of examples 7 through 15.

According to example 41, there is provided a chipset arranged to perform the method of any of examples 7 through 15.

According to example 42, there is provided at least one machine readable medium comprising a plurality of instructions that, in response to be being executed on a computing device, cause the computing device to carry out the method according to any of examples 7 through 15.

According to example 43, there is provided a device configured for provision of supporting content, the device being arranged to perform the method of any of examples 7 through 15.

According to example 44, there is provided a system for provision of supporting content including at least a device, the system being arranged to perform the method of any of examples 28 through 31.

According to example 45 there is provided a chipset arranged to perform the method of any of examples 28 through 31.

According to example 46, there is provided at least one machine readable medium comprising a plurality of instructions that, in response to be being executed on a computing device, cause the computing device to carry out the method according to any of examples 28 through 31.

According to example 47, there is provided a device configured for provision of supporting content, the device being arranged to perform the method of any of examples 28 through 31.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The modules may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more storage mediums (e.g., non-transitory storage mediums) having stored thereon, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software modules executed by a programmable control device.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A system to reduce power supply sensitivity, the system comprising:
    a multiplexer to receive a feedback signal and an inverted feedback signal;
    a delay-locked loop (DLL) communicably coupled to the multiplexer to:
        receive the feedback signal from the multiplexer and determine a first delay code value corresponding to a quantity of delay added to a DLL delay chain to cause alignment of a leading edge of a pulse in the feedback signal with a leading edge of a pulse in a reference clock signal;
        receive the inverted feedback signal from the multiplexer and determine a second delay code value corresponding to a quantity of delay added to a DLL delay chain to cause alignment of a leading edge of a pulse in the inverted feedback signal with a leading edge of a pulse in a reference clock signal; and
    a DLL training circuit communicably coupled to the multiplexer and the DLL to:
        receive the first delay code value and the second delay code value from the DLL and cause the DLL to selectively transfer a delay corresponding to a smaller temporal interval of the first delay code value or the second delay code value to the DLL delay chain.

2. The system of claim 1, further comprising:
    an inverter communicably coupled to the multiplexer, the inverter to invert the feedback signal and provide the inverted feedback signal.

3. The system of claim 1, the DLL training circuit to further:
    cause the multiplexer to communicate the feedback signal to the DLL at a first time and the inverted feedback signal to the DLL at a second time.

4. The system of claim 3, the DLL training circuit to further:
    cause the multiplexer to communicate the feedback signal to the DLL at a first time responsive to receipt of a DLL reset signal.

5. The system of claim 1, the DLL training circuit to further:
    cause the DLL to enter a training mode in which the DLL determines the first delay code value and the second delay code value but does not transfer either of the first delay code value or the second delay code value to the DLL delay chain.

6. The system of claim 5, the DLL training circuit to further:
    cause the DLL to exit the training mode and transfer the smaller temporal value of either the first delay code or the second delay code to the DLL delay chain responsive to exiting the training mode.

7. A method of reducing power supply sensitivity, the method comprising:
    receiving at a multiplexer, a feedback signal and an inverted feedback signal;
    receiving, by a delay-locked loop (DLL), a reference clock signal;
    receiving, by the DLL, the feedback signal from the multiplexer and determining a first delay code value corresponding to a quantity of delay added to a DLL delay chain to align a leading edge of a pulse in the feedback signal with a leading edge of a pulse in the reference clock signal;
    receiving, by the DLL, the inverted feedback signal from the multiplexer and determining a second delay code value corresponding to a quantity of delay added to the DLL delay chain to align a leading edge of a pulse in the inverted feedback signal with a leading edge of a pulse in the reference clock signal;
    receiving, by a DLL training circuit communicably coupled to the DLL and the multiplexer, the first delay code value and the second delay code value; and
    causing, by the DLL training circuit, the DLL to selectively load into the DLL delay chain the smaller of the first delay code value or the second delay code value.

8. The method of claim 7, further comprising:
    inverting the feedback signal, via an inverter communicably coupled to the multiplexer, to provide the inverted feedback signal.

9. The method of claim 7 wherein determining a first delay code value corresponding to a quantity of delay added to a DLL delay chain to align a leading edge of a pulse in the feedback signal with a leading edge of a pulse in the reference clock signal comprises:
    determining, by the DLL, the first delay code value corresponding to a quantity of temporal delay added to the DLL delay chain to align the leading edge of the pulse in the feedback signal with the leading edge of the pulse in the reference clock signal.

10. The method of claim 9 wherein determining a second delay code value corresponding to a quantity of delay added to the DLL delay chain to align a leading edge of a pulse in the inverted feedback signal with a leading edge of a pulse in the reference clock signal comprises:
determining, by the DLL, the second delay code value corresponding to a quantity of temporal delay added to the DLL delay chain to align the leading edge of the pulse in the inverted feedback signal with the leading edge of the pulse in the reference clock signal.

11. The method of claim 7 wherein receiving the feedback signal from the multiplexer comprises:
receiving, by the DLL, the feedback signal from the multiplexer at a first time.

12. The method of claim 11 wherein receiving the inverted feedback signal from the multiplexer comprises:
receiving, by the DLL, the inverted feedback signal from the multiplexer at a second time.

13. The method of claim 12, further comprising:
receiving, by the DLL training circuit, a DLL reset signal; and
causing the multiplexer to communicate the feedback signal to the DLL at the first time and the inverted feedback signal to the DLL at the second time responsive to receipt of the DLL reset signal.

14. The method of claim 7, further comprising:
causing, by the DLL training circuit, the DLL to enter a training mode in which the DLL determines the first delay code value and the second delay code value but does not transfer either of the first delay code value or the second delay code value to the DLL delay chain, prior to receiving the feedback signal and the inverted feedback signal from the multiplexer.

15. The method of claim 14, further comprising:
causing, by the DLL training circuit, the DLL to exit the training mode and transfer the smaller temporal value of either the first delay code or the second delay code to the DLL delay chain responsive to exiting the training mode.

16. A storage device that includes machine executable instruction sets that, when executed by a circuit, cause the circuit to function as a DLL training circuit that reduces power supply sensitivity by causing the DLL training circuit to:
provide a feedback signal and an inverted feedback signal to a multiplexer;
provide a reference clock signal to a delay-locked loop (DLL);
transmit the feedback signal from the multiplexer to the DLL;
cause the DLL to determine a first delay code value corresponding to a quantity of delay added to a DLL delay chain to align a leading edge of a pulse in the feedback signal with a leading edge of a pulse in the reference clock signal;
transmit the inverted feedback signal to the DLL;
cause the DLL to determine a second delay code value corresponding to a quantity of delay added to the DLL delay chain to align a leading edge of a pulse in the inverted feedback signal with a leading edge of a pulse in the reference clock signal;
receive the first delay code value and the second delay code value; and
cause the DLL to selectively transfer to the DLL delay chain the smaller of the first delay code value or the second delay code value.

17. The storage device of claim 16, further comprising machine executable instruction sets that, when executed by the DLL training circuit, cause the DLL training circuit to invert the feedback signal to provide the inverted feedback signal.

18. The storage device of claim 16, further comprising machine executable instruction sets that, when executed by the DLL training circuit, cause the DLL training circuit to transmit the feedback signal from the multiplexer to the DLL at a first time.

19. The storage device of claim 18, further comprising machine executable instruction sets that, when executed by the DLL training circuit, cause the DLL training circuit to transmit the inverted feedback signal from the multiplexer to the DLL at a second time.

20. The storage device of claim 18, further comprising machine executable instruction sets that, when executed by the DLL training circuit, cause the DLL training circuit to:
receive a DLL reset signal; and
cause the multiplexer to transmit the feedback signal to the DLL at the first time and the inverted feedback signal to the DLL at the second time responsive to receipt of the DLL reset signal.

21. The storage device of claim 18, further comprising machine executable instruction sets that, when executed by the DLL training circuit, cause the DLL training circuit to:
cause the DLL to enter a training mode in which the DLL determines the first delay code value and the second delay code value but does not transfer either of the first delay code value or the second delay code value to the DLL delay chain, prior to receiving the feedback signal and the inverted feedback signal from the multiplexer.

22. The storage device of claim 21, further comprising machine executable instruction sets that, when executed by the DLL training circuit, cause the DLL training circuit to:
cause the DLL to exit the training mode and transfer the smaller temporal value of either the first delay code or the second delay code to the DLL delay chain responsive to exiting the training mode.

23. A system for reducing power supply sensitivity, the system comprising:
a means for receiving a feedback signal and an inverted feedback signal;
a means for receiving a reference clock signal;
a means for transmitting the feedback signal to a delay-locked loop (DLL) and determining a first delay code value corresponding to a quantity of delay added to a DLL delay chain to align a leading edge of a pulse in the feedback signal with a leading edge of a pulse in the reference clock signal;
a means for transmitting the inverted feedback signal to the delay-locked loop (DLL) and determining a second delay code value corresponding to a quantity of delay added to the DLL delay chain to align a leading edge of a pulse in the inverted feedback signal with a leading edge of a pulse in the reference clock signal;
a means for transmitting the first delay code value and the second delay code value to a DLL training circuit; and
a means for selectively transferring the smaller of the first delay code value or the second delay code value to the DLL delay chain.

24. The system of claim 23, further comprising:
a means for causing the DLL to enter a training mode in which the DLL determines the first delay code value and the second delay code value but does not transfer either of the first delay code value or the second delay code value to the DLL delay chain, prior to receiving the feedback signal and the inverted feedback signal from the multiplexer.

25. The system of claim 24, further comprising:
a means for causing the DLL to exit the training mode and selectively transfer the smaller temporal value of either the first delay code or the second delay code to the DLL delay chain responsive to exiting the training mode.

* * * * *